(12) United States Patent
Buckley

(10) Patent No.: US 11,398,547 B2
(45) Date of Patent: Jul. 26, 2022

(54) JUNCTION BARRIER SCHOTTKY DIODE

(71) Applicant: COMMISSARIAT A L'ENERGIE ATOMIQUE ET AUX ENERGIES ALTERNATIVES, Paris (FR)

(72) Inventor: Julien Buckley, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/230,399

(22) Filed: Apr. 14, 2021

(65) Prior Publication Data

US 2021/0328007 A1 Oct. 21, 2021

(30) Foreign Application Priority Data

Apr. 16, 2020 (FR) ...................... 2003847

(51) Int. Cl.
| | |
|---|---|
| *H01L 29/45* | (2006.01) |
| *H01L 29/47* | (2006.01) |
| *H01L 29/872* | (2006.01) |
| *H01L 29/06* | (2006.01) |
| *H01L 29/66* | (2006.01) |

(52) U.S. Cl.
CPC .......... *H01L 29/0619* (2013.01); *H01L 29/45* (2013.01); *H01L 29/47* (2013.01); *H01L 29/66143* (2013.01); *H01L 29/872* (2013.01)

(58) Field of Classification Search
CPC ..... H01L 29/0619; H01L 29/45; H01L 29/47; H01L 29/66143; H01L 29/872
USPC ....................................... 257/481
See application file for complete search history.

(56) References Cited

U.S. PATENT DOCUMENTS

| | | | | |
|---|---|---|---|---|
| 6,054,752 | A | * | 4/2000 | Hara ............... H01L 29/0638 257/652 |
| 2007/0210401 | A1 | | 9/2007 | Sanfilippo et al. |
| 2018/0097123 | A1 | | 4/2018 | Kajitani et al. |

(Continued)

FOREIGN PATENT DOCUMENTS

WO WO 2018/146791 A1 8/2018

OTHER PUBLICATIONS

Search Report as issued in French Patent Application No. 2003847, dated Nov. 24, 2020.

(Continued)

*Primary Examiner* — Monica D Harrison
(74) *Attorney, Agent, or Firm* — Pillsbury Winthrop Shaw Pittman LLP

(57) ABSTRACT

A JBS diode includes a substrate; a first semiconductor layer arranged on a first face of the substrate and having a first type of conductivity, the first semiconductor layer including a projecting portion delimited by a trench; a second semiconductor layer arranged on the projecting portion and having a second type of conductivity opposite to the first type of conductivity; an electrically insulating layer arranged at the bottom of the trench; a first electrode including a first portion in Schottky contact with the first semiconductor layer, the first portion being arranged on the electrically insulating layer and against a side wall of the projecting portion of the first semiconductor layer; a second portion in ohmic contact with the second semiconductor layer; a second electrode in ohmic contact with the substrate.

12 Claims, 6 Drawing Sheets

(56) References Cited

U.S. PATENT DOCUMENTS

2019/0165187 A1   5/2019   Tanaka et al.

OTHER PUBLICATIONS

Li, W., et al., "Design and Realization of GaN Trench Junction-Barrier-Schottky-Diodes," IEEE Transactions On Electron Devices, vol. 64, No. 4, Apr. 2017, pp. 1635-1641.
Zhang, Y., et al., "Vertical GaN Junction Barrier Schottky Rectifiers by Selective Ion Implantation," IEEE Electron Device Letters, vol. 38, No. 8, Aug. 2017, pp. 1097-1100.
Koehler, A. D., et al., "Vertical GaN Junction Barrier Schottky Diodes by Mg Implantation and Activation Annealing," IEEE, (2016), pp. 344-346.
Kajitani, R., et al., "A High Current Operation in a 1.6 kV GaN-based Trenched Junction Barrier Schottky (JBS) Diode," Extended Abstracts of the 2015 International Conference on Solid State Devices and Materials, Sapporo, (2015), pp. 1056-1057.

* cited by examiner

JUNCTION BARRIER SCHOTTKY DIODE

CROSS-REFERENCE TO RELATED APPLICATIONS

This application claims priority to French Patent Application No. 2003847, filed Apr. 16, 2020, the entire content of which is incorporated herein by reference in its entirety.

FIELD

The technical field of the invention is that of power electronics. The present invention relates to a diode capable of withstanding current overloads and more specifically a junction barrier Schottky (JBS) diode.

BACKGROUND

Diodes are conventional components of power electronics because they enable the implementation of basic functions such as switching, rectification, voltage division, etc.

It is particularly beneficial in the field of power electronics that diodes have a high switching speed, a low resistivity in the ON state (that is to say a high current in the ON state) and a high breakdown voltage. The resistivity in the ON state and the breakdown voltage of a diode strongly depend on the semiconductor material used to manufacture the diode. Gallium nitride (GaN) is widely employed because it has one of the best compromises between resistivity in the ON state and breakdown voltage.

The junction barrier Schottky (JBS) diode is a mixed Schottky-bipolar diode comprising a Schottky diode and a bipolar diode (typically a PIN (P-type Intrinsic N-type) diode) coupled in parallel. At low forward bias voltage, the JBS diode has an essentially Schottky behaviour characterised by a low threshold voltage. At stronger forward bias voltage, the JBS diode has an essentially bipolar behaviour characterised by a decrease in resistivity, which allows it to withstand current overloads. One also speaks of overload diode or MPS (Merged PIN Schottky) diode if by design the diode exploits Schottky and bipolar conduction modes.

A JBS diode typically comprises an alternation of PN junctions and Schottky junctions (metal-semiconductor junctions). Under reverse bias, the space charge region of PN junctions are going to extend under the Schottky contact and to become covered from a certain reverse voltage, then leading to the creation of a potential barrier between cathode and anode. This potential barrier reduces the electric field under the Schottky contact and, consequently, the leakage current that depends thereon.

The JBS diode thus cumulates the benefits of the Schottky diode in terms of threshold voltage and switching speed and the benefits of the PIN diode in terms of leakage current (under reverse bias) and robustness to current overloads (under strong forward bias).

The document ["Vertical GaN junction barrier schottky diodes by Mg implantation and activation annealing", A. D. Koehler et al., 2016 IEEE 4th Workshop on Wide Bandgap Power Devices and Applications (WiPDA). IEEE, pp. 344-346, 2016] describes a first example of GaN JBS diode. The PN junctions are formed by implantation of p type dopants (typically magnesium ions) in an active layer called "drift layer" made of unintentionally doped GaN (UID GaN).

FIG. 1 represents a second example of GaN JBS diode, such as described in the document ["Design and realization of GaN trench junction-barrier-Schottky-diodes", W. Li et al., IEEE Transactions on Electron Devices, Vol. 64, No. 4, pp. 1635-1641, 2017].

The GaN JBS diode comprises:
- a substrate 10 made of GaN;
- a layer of n$^+$-GaN 11 (strongly n type doped GaN) arranged on a first face of the substrate 10;
- a drift layer 12 made of n-GaN (more weakly n type doped GaN) arranged on the layer of n$^+$-GaN 11;
- a layer of p-GaN 13 (p type doped GaN) arranged on the drift layer 12 and in which are formed circular trenches 13', the circular trenches 13' extending down to the drift layer 12;
- an anode 14 arranged on the p-GaN 13 layer and in the trenches 13', in ohmic contact with the p-GaN 13 layer and in Schottky contact with the drift layer 12 made of n-GaN;
- a cathode 15 arranged on a second opposite face of the substrate 11.

Thus, in this trench JBS diode, the Schottky junctions are situated at the same level as the PN junctions. The document shows that, when the diameter of the trenches decreases (at constant diode surface), the reverse leakage current and the nominal operating current decrease and the permissible overload current increases. The dimensioning of the diode structure of FIG. 1 has a simultaneous influence on these three electrical currents. Thus, it is not possible to fix them in an independent manner.

SUMMARY

It therefore exists a need to provide a junction barrier Schottky (JBS) diode structure making it possible to adjust one of the electrical parameters of the diode in an independent manner.

According to a first aspect of the invention, this need tends to be satisfied by providing a junction barrier Schottky (JBS) diode comprising:
- a substrate;
- a first semiconductor layer arranged on a first face of the substrate and having a first type of conductivity, the first semiconductor layer comprising a projecting portion delimited by a trench;
- a second semiconductor layer arranged on the projecting portion of the first semiconductor layer and having a second type of conductivity opposite to the first type of conductivity;
- an electrically insulating layer arranged at the bottom of the trench;
- a first electrode comprising:
  - a first portion in Schottky contact with the first semiconductor layer, the first portion of the first electrode being arranged on the electrically insulating layer and against a side wall of the projecting portion of the first semiconductor layer;
  - a second portion in ohmic contact with the second semiconductor layer;
- a second electrode in ohmic contact with the substrate.

The formation of a lateral Schottky contact, rather than in the plane of the PN junction, makes it possible to decorrelate the Schottky contact surface and the PN junction surface while minimising the leakage current. It then becomes easier to dimension the JBS diode to attain the desired performances. In particular, the permissible overload current of the JBS diode (which is characteristic of bipolar operation) may thus be adjusted independently of the reverse leakage current and the nominal operating current (which are characteristic of Schottky operation).

In a first embodiment, the second electrode is arranged on a second face of the substrate opposite to the first face.

In a second embodiment, the first semiconductor layer only occupies a part of the first face of the substrate and the second electrode is arranged on the first face of the substrate.

In a third embodiment compatible with the two preceding embodiments, the first semiconductor layer comprises a plurality of projecting portions each delimited by a trench, the second semiconductor layer is arranged on the plurality of projecting portions of the first semiconductor layer, the first portion of the first electrode is arranged against a side wall of each projecting portion of the first semiconductor layer and the second portion of the first electrode is arranged on each projecting portion of the first semiconductor layer in contact with the second semiconductor layer.

Apart from the characteristics that have been evoked in the preceding paragraphs, the JBS diode according to the first aspect of the invention may have one or more complementary characteristics among the following, considered individually or according to all technically possible combinations thereof:
- the Schottky contact has a height ($H_S$) comprised between 0.1 µm and 3 µm;
- the electrically insulating layer has a thickness greater than or equal to 0.05 µm;
- the first portion of the first electrode is formed by a layer of a first metal and the second portion of the first electrode is formed by a layer of a second metal, distinct from the first metal;
- the second metal has a work function greater than the work function of the first metal;
- the substrate comprises a layer of semiconductor material doped with the first type of conductivity; and
- the layer of semiconductor material of the substrate has a concentration of doping impurities greater than or equal to $10^{17}$ cm$^{-3}$.

A second aspect of the invention relates to a method for manufacturing a junction barrier Schottky diode. This method comprises the following steps:
- forming a stack comprising successively a substrate, a first semiconductor layer having a first type of conductivity and a second layer having a second type of conductivity opposite to the first type of conductivity;
- etching a trench in the second semiconductor layer and a part of the first semiconductor layer, so as to delimit a projecting portion of the first semiconductor layer and to limit the second semiconductor layer to the projecting portion of the first semiconductor layer;
- forming an electrically insulating layer at the bottom of the trench;
- forming a first electrode comprising:
  - a first portion in Schottky contact with the first semiconductor layer, the first portion of the first electrode being arranged on the electrically insulating layer and against a side wall of the projecting portion of the first semiconductor layer;
  - a second portion in ohmic contact with the second semiconductor layer;
- forming a second electrode in ohmic contact with the substrate.

In an embodiment, the step of etching the trench has an isotropy coefficient greater than 0.3.

In an embodiment, the step of formation of the electrically insulating layer at the bottom of the trench comprises the following operations:
- forming a dielectric material layer comprising a first portion arranged at the bottom of the trench and a second portion arranged against the side wall of the projecting portion of the first semiconductor layer, the first portion having a thickness greater than that of the second portion; and
- etching in an isotropic manner the dielectric material layer so as to only remove the second portion.

Thus, the dielectric material layer is deposited in an anisotropic manner.

In an embodiment, the step of formation of the first electrode comprises the following operations:
- depositing a layer of a first metal on the electrically insulating layer, against the side wall of the projecting portion of the first semiconductor layer and on the second semiconductor layer;
- forming in the layer of the first metal an opening emerging on the second semiconductor layer;
- depositing a layer of a second metal in the opening, in contact with the second semiconductor layer, the second metal being distinct from the first metal.

The invention and the applications thereof will be better understood on reading the description that follows and by examining the figures that accompany it.

BRIEF DESCRIPTION OF THE FIGURES

Other characteristics and benefits of the invention will become clear from the description that is given thereof below, for indicative purposes and in no way limiting, with reference to the appended figures, among which.

For greater clarity, identical or similar elements are marked by identical reference signs in all of the figures.

DETAILED DESCRIPTION

Figure 1:
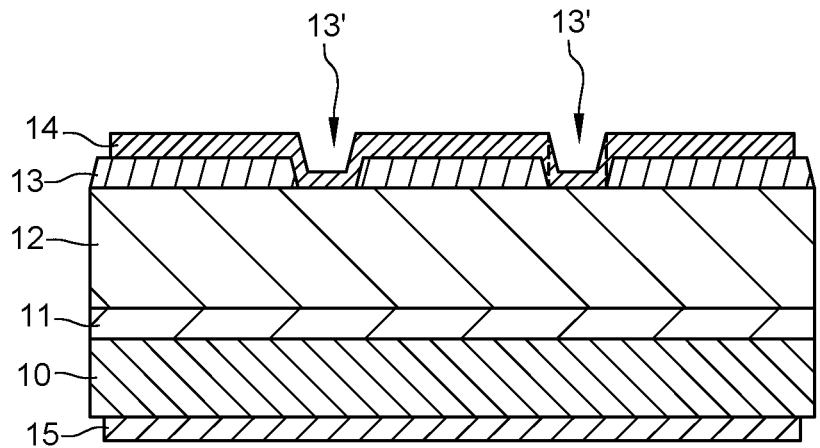
FIG. 1, described previously, is a sectional view of a junction barrier Schottky (JBS) diode according to the prior art.
Figure 2:
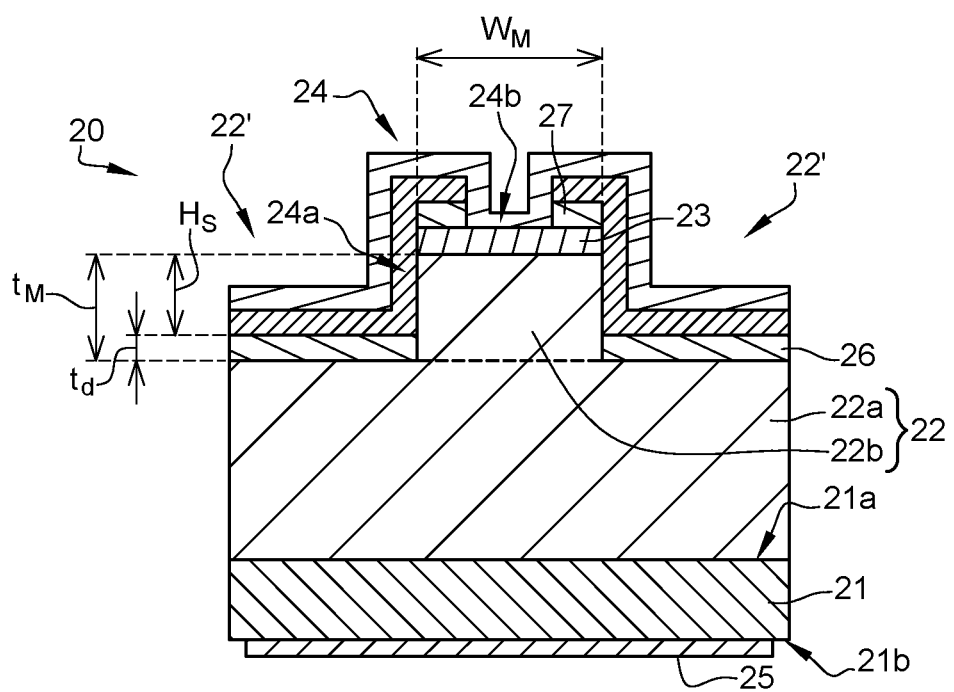
FIG. 2 schematically represents a first embodiment of a junction barrier Schottky (JBS) diode according to the first aspect of the invention.

FIG. 2 is a schematic sectional view of a junction barrier Schottky (JBS) diode 20 according to a first embodiment. This type of diode finds beneficial applications in power electronics, for example as current rectifiers or in voltage "buck" or "boost" converters.

The JBS diode 20 can switch reversibly between a first state called "conducting state" (or "ON state) and a second state called "non-conducting state" (or "OFF state"). In the ON state, the JBS diode 20 is traversed by a high electric current, for example comprised between 1 A to 100 A, and has a low voltage at its terminals, typically less than 10 V. In the OFF state, only a leakage current traverses the diode and the voltage at its terminals may be particularly high, several hundreds of volts (in absolute value). The JBS diode 20 is OFF when it is reverse biased and ON when it is forward biased at a voltage greater than the threshold voltage.

The JBS diode 20 comprises:
- a substrate 21;
- a first semiconductor layer 22, arranged on a first face 21a of the substrate 21 and having a first type of conductivity;
- a second semiconductor layer 23, arranged on a part of the first semiconductor layer 22 and having a second type of conductivity opposite to the first type of conductivity;
- a first electrode 24 hereafter called "anode" comprising a first portion 24a in Schottky contact with the first semiconductor layer 22 and a second portion 24b in ohmic contact with the second semiconductor layer 23;
- a second electrode 25 hereafter called "cathode" in ohmic contact with the substrate 21.

In this first embodiment, the cathode 25 is arranged on a second face 21b of the substrate 21, opposite to the first face 21a. The JBS diode 20 then has a so-called "vertical" architecture, because the two electrodes of the JBS diode 20 are arranged on either side of the substrate 21. The substrate 21 is, in an embodiment, formed of a semiconductor material doped with the first type of conductivity, for example of n type. The substrate 21 is for example comprised of strongly n doped gallium nitride (n$^+$-GaN). The concentration of doping impurities of n type (for example silicon atoms in the case of GaN) of the substrate 21 is in an embodiment comprised between $10^{17}$ cm$^{-3}$ and $10^{20}$ cm$^{-3}$, for example equal to $10^{18}$ cm$^{-3}$.

The first semiconductor layer 22, also called "drift layer", is for example a layer of n-GaN, that is to say a layer of n type doped GaN. The concentration of doping impurities of n type of the first semiconductor layer 22 is beneficially less than that of the substrate 21. It is in an embodiment comprised between $10^{14}$ cm$^{-3}$ and $10^{17}$ cm$^{-3}$, for example equal to $10^{16}$ cm$^{-3}$. The thickness td of the first semiconductor layer 22 is beneficially greater than 4 μm in order to confer on the JBS diode 20 good reverse voltage withstand, for example at least 600 V (in absolute value).

The first semiconductor layer 22 comprises a first portion 22a called "base portion", arranged on the substrate 21, and a second portion 22b projecting with respect to an upper face of the base portion 22a. The base portion 22a and the projecting portion 22b of the first semiconductor layer 22 may be qualified respectively as "lower portion" and "upper portion".

The base portion 22a of the first semiconductor layer 22 occupies in this first embodiment the whole first face 21a of the substrate 21.

The projecting portion 22b of the first semiconductor layer 22 is delimited laterally by one or more trenches 22'. Each trench 22' enables the formation of a lateral Schottky contact on the first semiconductor layer 22. Each trench 22' may be rectilinear and delimit a part (that is to say a side) only of the projecting portion 22b.

Such as represented in section in FIG. 2, the projecting portion 22b of the first semiconductor layer 22 may be delimited by two trenches 22', rectilinear and parallel with each other, or by a single annular trench 22', situated at the periphery of the projecting portion 22b. The projecting portion 22b then has respectively the form of a line or a cylinder.

The projecting portion 22b of the first semiconductor layer 22 has an upper face, in an embodiment oriented parallel to the first face 21a of the substrate 21, and one or more side walls, in an embodiment oriented perpendicularly to the first face 21a of the substrate 21.

The second semiconductor layer 23 is arranged on the projecting portion 22b of the first semiconductor layer 22 and forms a PN junction with the first semiconductor layer 22 (here a PN$^-$ junction because the first semiconductor layer 22 is lightly n type doped). In an embodiment, the second semiconductor layer 23 entirely covers the upper face of the projecting portion 22b. It beneficially comprises the same semiconductor material as that of the first semiconductor layer 22. The second semiconductor layer 23 is for example a layer of p-GaN, that is to say a layer of p type doped GaN. The concentration of doping impurities of p type of the second semiconductor layer 23 is in an embodiment comprised between $10^{18}$ cm$^{-3}$ and $10^{19}$ cm$^{-3}$, for example equal to $10^{19}$ cm$^{-3}$, except potentially at the interface with the second portion 24b of the first electrode 24 where it may be greater than $10^{19}$ cm$^{-3}$, for example equal to $10^{20}$ cm$^{-3}$.

The JBS diode 20 further comprises a first electrically insulating layer 26 arranged at the bottom of the trench 22' (or trenches 22' when the projecting portion 22b is delimited by several trenches 22'). The first electrically insulating layer 26 prevents the anode 24 from being in electrical contact with the base portion 22a of the first semiconductor layer 22. The first electrically insulating layer 26 may be comprised of a dielectric material, for example silicon dioxide (SiO$_2$), silicon nitride (Si$_3$N$_4$ or SiN), or silicon oxycarbide (SiOC), or of several stacked dielectric materials, for example a SiO$_2$/SOG bilayer stack, a Si$_3$N$_4$/SOG (spin on glass) bilayer stack. Its (total) thickness td is in an embodiment greater than or equal to 0.05 μm, for example equal to 0.3 μm.

The first portion 24a of the anode 24 is arranged on the first electrically insulating layer 26 and against one or more side walls of the projecting portion 22b. It beneficially covers the whole lateral surface of the projecting portion 22b. It forms a Schottky contact with the first semiconductor layer 22, here made of n-GaN. Thus, the Schottky contact of the JBS diode 20 may be limited to one or more side walls of the projecting portion 22b.

The second portion 24b of the anode 24 forms an ohmic contact with the second semiconductor layer 23, here made of p-GaN. It is in an embodiment arranged on the upper face of the second semiconductor layer 23.

As is represented in FIG. 2, the first portion 24a of the anode 24 may be formed by a first metal layer, in Schottky contact with the projecting portion 22b of the first semiconductor layer 22, and the second portion 24b of the anode 24 may be formed by a second metal layer, in ohmic contact with the second semiconductor layer 23.

The first metal layer is comprised of a first metal and the second metal layer is comprised of a second metal, distinct from the first metal. The barrier height of the Schottky contact and the contact resistance between the second metal layer and the second semiconductor layer 23 (ohmic contact) may thus be both optimised, by choosing two metals having different work functions. Each of the first and second metal layers may be comprised of a pure metal or a metal alloy.

When the first semiconductor layer 22 has an n type doping and the second semiconductor layer 23 has a p type doping, the second metal beneficially has a work function greater than the work function of the first metal. For example, the first metal is chosen from titanium nitride (TiN), aluminium (Al) and tantalum nitride (TaN), whereas the second metal is chosen from nickel (Ni), platinum (Pt), gold (Au) and palladium (Pd).

Each of the first and second metal layers may be covered with one or more other metal layers (not represented in FIG. 2) to form a multilayer stack, for example a bilayer stack of Ni/Au type.

The second metal layer may extend onto the first metal layer. Furthermore, the first metal layer may extend onto the second semiconductor layer 23. Beneficially, the JBS diode 20 comprises a second electrically insulating layer 27 arranged on a part of the second semiconductor layer 23. This second electrically insulating layer 27 limits the contact between the first metal layer and the second semiconductor layer 23.

In an alternative embodiment not represented by the figures, the first and second portions 24a-24b of the anode 24 are formed by a same metal layer, in Schottky contact with the first semiconductor layer 22 and in ohmic contact with the second semiconductor layer 23. This metal layer may be comprised of a pure metal (e.g. nickel, platinum, palladium, gold, silver, etc.) or a metal alloy. It may also be covered with one or more other metal layers to form a multilayer stack.

The JBS diode 20 may have, as is represented in FIG. 2, a vertical axis of symmetry passing through the projecting portion 22b. When the projecting portion 22b is delimited by two trenches 22', rectilinear and parallel with each other, the first electrically insulating layer 26 is beneficially arranged at the bottom of each trench 22', on either side of the projecting portion 22b, and the first portion 24a of the anode 24 is beneficially arranged against two opposite side walls of the projecting portion 22b. When the projecting portion 22b is delimited by a single annular trench 22', the first electrically insulating layer 26 and the first portion 24a of the anode 24 are beneficially arranged at the periphery of the projecting portion 22b, respectively at the bottom of the annular trench 22' and against the annular side wall of the projecting portion 22b.

From an electrical viewpoint, the JBS diode 20 comprises a Schottky diode and a PIN diode coupled in parallel (the intrinsic zone "I" corresponding to the first semiconductor layer 22 weakly n type doped). The JBS diode has an essentially Schottky behaviour in nominal operation, that is to say at low forward bias voltage, and an essentially bipolar behaviour at stronger forward bias voltage, which allows it to withstand current overloads.

Under reverse bias, the projecting portion 22b of the first semiconductor layer 22 is depleted under the effect of the PN junction and the Schottky junction, creating a potential barrier between the anode 24 and the cathode 25. This potential barrier reduces the electric field in the projecting portion 22b of the first semiconductor layer 22 and, consequently, the reverse leakage current of the diode.

The JBS diode 20 is remarkable in that the surface of the PN junction (defined as the contact surface between the first semiconductor layer 22 and the second semiconductor layer 23) and the surface of the Schottky junction (defined as the contact surface between the first portion 24a of the anode 24 and the first semiconductor layer 22) are situated in secant and, in an embodiment, orthogonal planes. Thus, the surface of the PN junction may be increased without this having an impact on the surface of the Schottky junction, and vice versa. This brings greater flexibility in the dimensioning of the JBS diode and makes it possible to adjust one of the electric parameters of the JBS diode in an independent manner, as described hereafter in relation with FIGS. 5 and 6.

Figure 3:
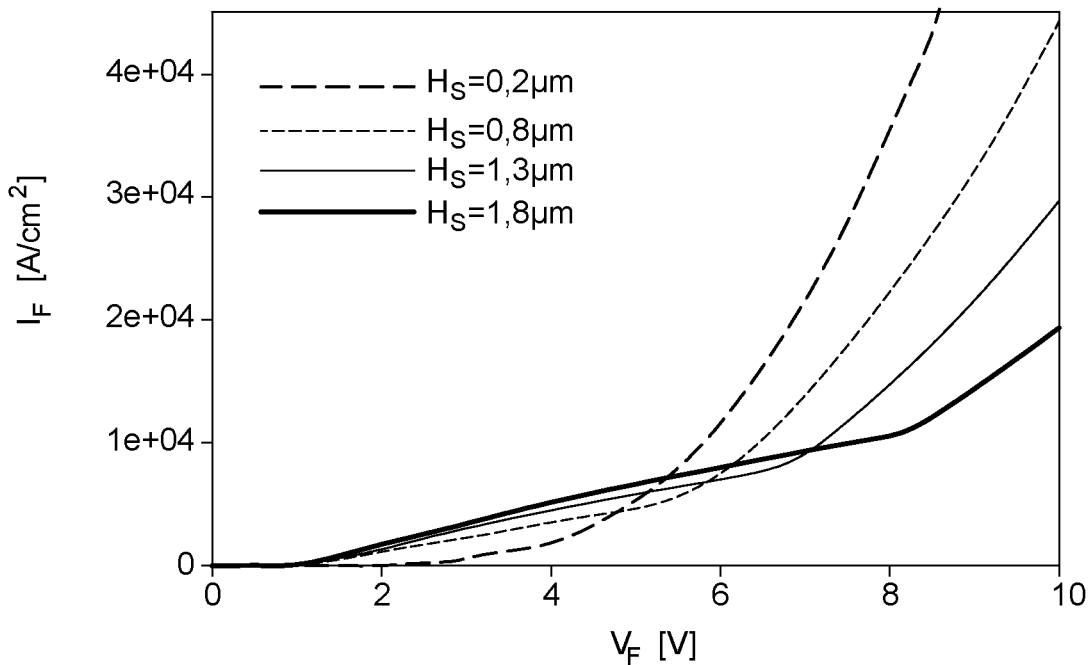
FIG. 3 shows forward I-V characteristics of a JBS diode according to FIG. 2, these I-V characteristics corresponding to different Schottky contact heights.

FIG. 3 represents the direct current density $I_F$ of a JBS diode 20 according to FIG. 2 as a function of the forward bias voltage $V_F$, for different Schottky contact height values $H_S$. The current density $I_F$ is normalised by dividing the total current of the diode by the total surface of the diode.

The Schottky contact height $H_S$ is the dimension of the surface of the Schottky junction measured perpendicularly to the first face 21a of the substrate 21. In the embodiment of FIG. 2, the Schottky contact height $H_S$ is given by the following relationship:

$$H_S = t_M - t_d \quad \text{[Math 1]}$$

where $t_M$ is the thickness of the projecting portion 22b of the first semiconductor layer 22 and $t_d$ is the thickness of the first electrically insulating layer 26.

FIG. 3 shows that the current in nominal operation (that is to say in Schottky operation) and the voltage of switching between nominal operation (Schottky conduction mode) and current overload operation (bipolar conduction mode) increases when the Schottky contact height $H_S$ increases.

Figure 4:
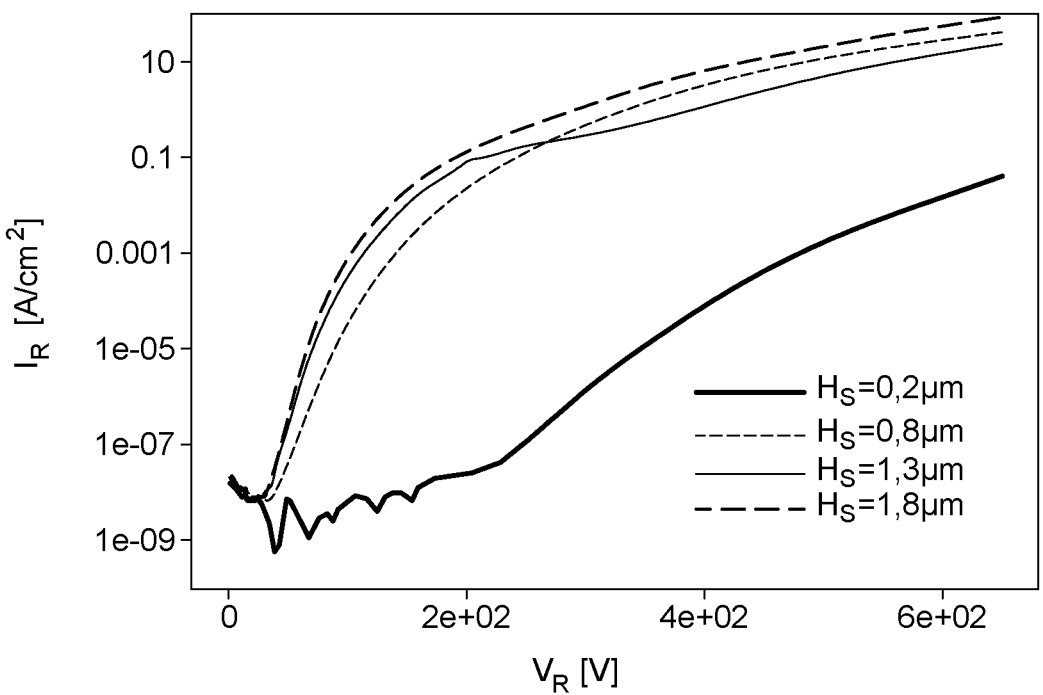
FIG. 4 shows reverse I-V characteristics of the JBS diode, these I-V characteristics corresponding to different Schottky contact heights.

FIG. 4 represents, for this same JBS diode and for the same Schottky contact height values $H_S$, the reverse current density IR as a function of the reverse bias voltage $V_R$ (in absolute value). It is notable that the leakage current decreases when the Schottky contact height $H_S$ decreases. It reaches a minimum value when the Schottky contact height $H_S$ is substantially equal to or less than the height of the space charge region of the PN junction.

Thus, the nominal operating current and the reverse leakage current of the JBS diode 20 may be adjusted by varying the Schottky contact height $H_S$.

Generally speaking, a good compromise between nominal operating current and reverse leakage current may be obtained for a Schottky contact height $H_S$ comprised between 0.1 μm and 3 μm.

The intersection of the curves $H_S=0.8$ μm and $H_S=1.3$ μm is attributed to the difference in the angle between the side wall of the projecting portion 22b and the first electrically insulating layer 26. This angle is reduced in the case $H_S=1.3$ μm on account of a greater etching depth.

Figure 5:
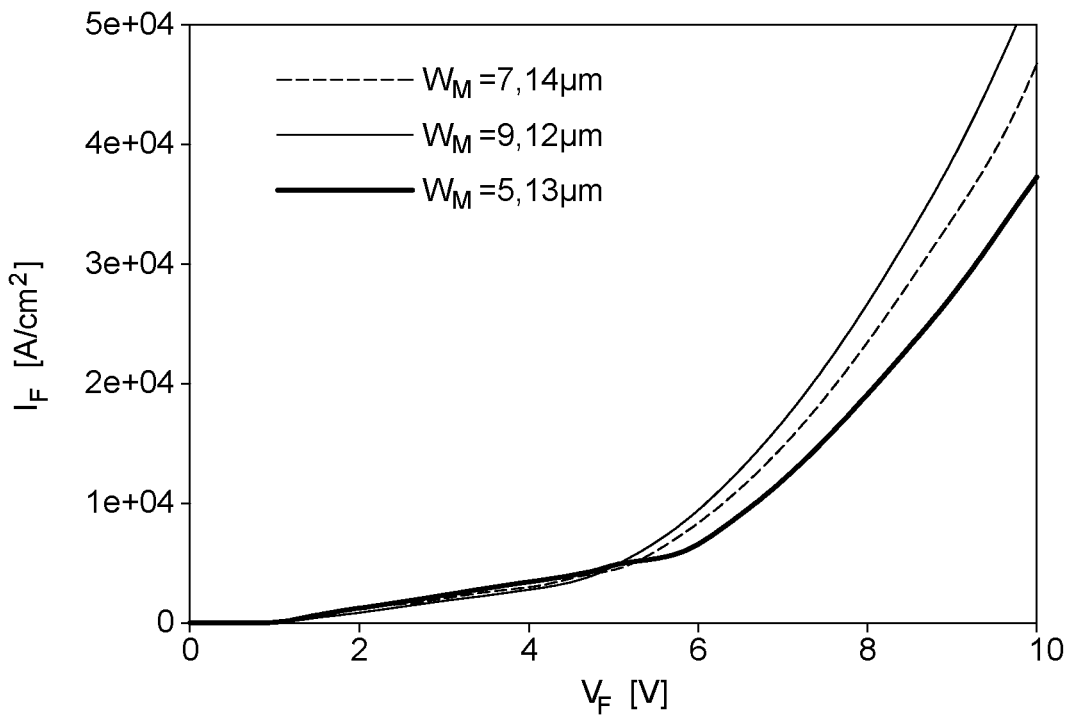
FIG. 5 shows forward I-V characteristics of the JBS diode, these I-V characteristics corresponding to different PN junction widths.

FIG. 5 represents the direct current density $I_F$ of the JBS diode as a function of the direct bias voltage $V_F$ for different PN junction width values $W_M$. The PN junction width $W_M$ here corresponds to the width of the projecting portion 22b, measured parallel to the first face 21a of the substrate 21 in the sectional plane of FIG. 2 (typically the distance between two parallel rectilinear trenches or the internal diameter of the annular trench).

This figure shows that the permissible overload current (for a given forward bias voltage) increases with the PN junction width $W_M$. On the other hand, the PN junction width $W_M$ has virtually no influence on the nominal operating current.

Figure 6:
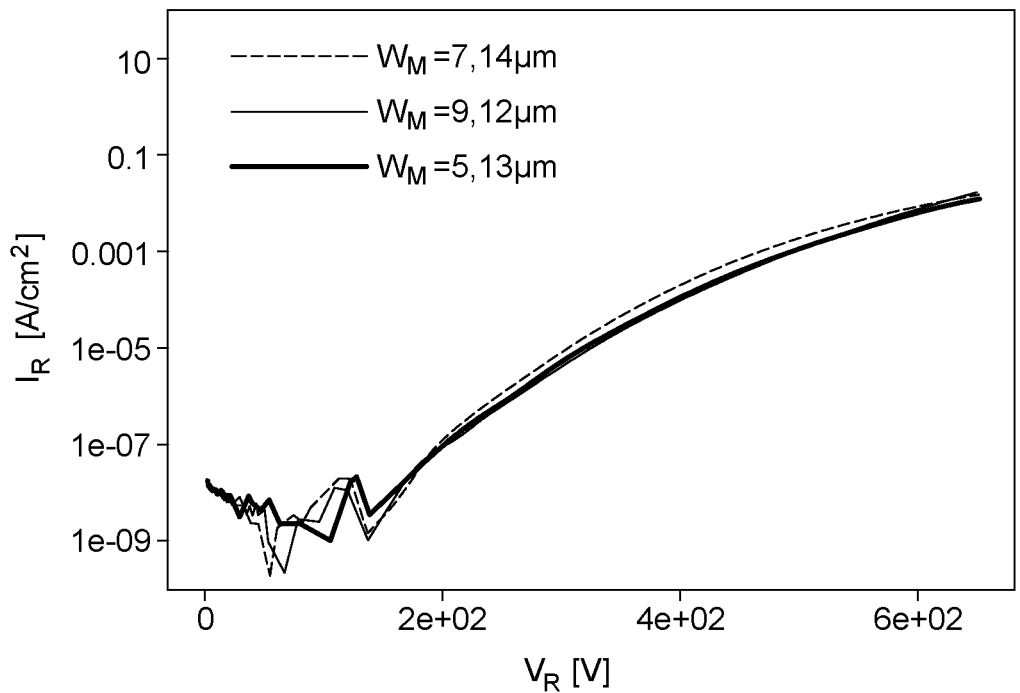
FIG. 6 shows reverse I-V characteristics of the JBS diode, these I-V characteristics corresponding to different PN junction widths.

According to FIG. 6, which represents the reverse current density IR of the JBS diode as a function of the reverse bias voltage $V_R$ for the same PN junction width values $W_M$, the PN junction width $W_M$ does not have a significant impact either on the reverse leakage current.

By playing on the width (or the diameter) of the projecting portion 22b of the first semiconductor layer 22, it is thus possible to adjust the permissible overload current of the JBS diode independently of the nominal operating current and the reverse leakage current. The width ($W_M$) of the projecting portion 22b of the first semiconductor layer 22 is in an embodiment comprised between 3 µm and 10 µm. The width of the trenches 22' may be comprised between 1 µm and 5 µm.

Figure 7:
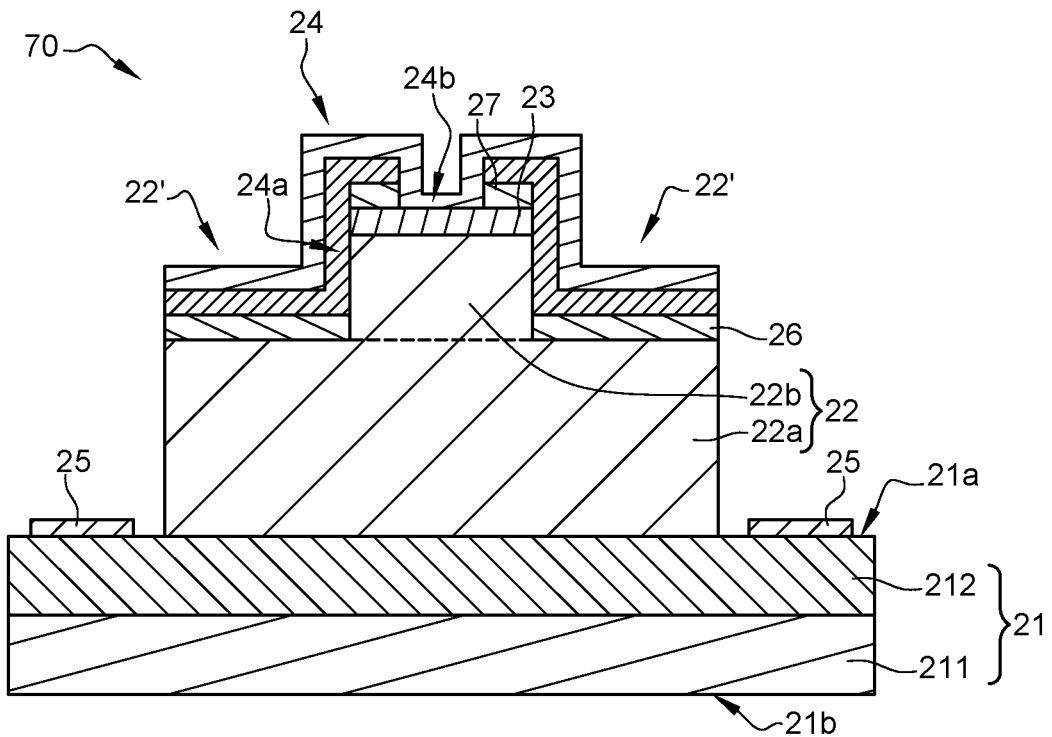
FIG. 7 schematically represents a second embodiment of junction barrier Schottky diode according to the first aspect of the invention.

FIG. 7 is a schematic sectional view of a JBS diode 70 according to a second embodiment. The JBS diode 70 according to the second embodiment has a so-called "pseudo-vertical" architecture. It differs from the JBS diode 20 according to the first embodiment (FIG. 2) in that the cathode 25 is arranged on a free portion of the first face 21a of the substrate 21 (and no longer on the second face 21b of the substrate 21).

Thus, in this second embodiment, the first semiconductor layer 22 only occupies a part of the first face 21a of the substrate 21. The cathode 25 is beneficially arranged symmetrically with respect to the stack comprising the first semiconductor layer 22, the second semiconductor layer 23, the anode 24 and the first electrically insulating layer 26.

The substrate 21 of the JBS diode 70 may be a so-called "hybrid" substrate comprising a support layer 211, for example made of silicon, silicon carbide (SiC) or sapphire, and a growth layer 212 made of semiconductor material doped with the first type of conductivity (for example made of n$^+$-GaN) arranged on the support layer 211. The substrate 21 may alternatively be a bulk or free-standing substrate comprised of the semiconductor material doped with the first type of conductivity.

The first semiconductor layer 22, the second semiconductor layer 23 and the anode 24 being configured in the same way as in the first embodiment, the JBS diode 70 benefits from the same benefits as the JBS diode 20 in terms of dimensioning.

Figure 8:
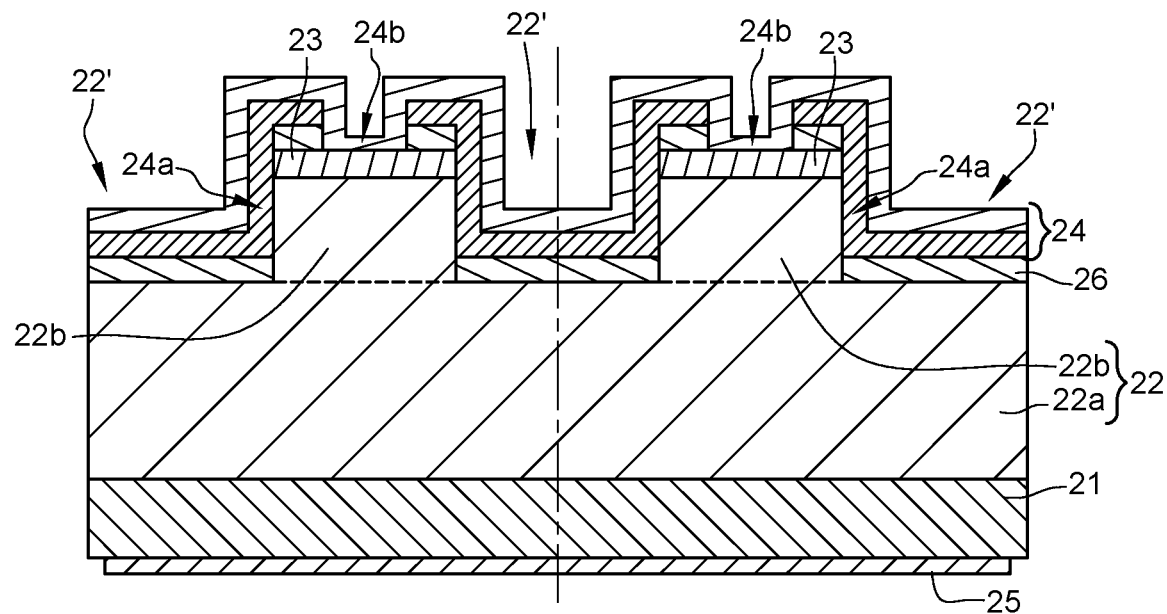
FIG. 8 schematically represents a third embodiment of junction barrier Schottky diode according to the first aspect of the invention.

In a third embodiment of JBS diode represented by FIG. 8, the first semiconductor layer 22 comprises a plurality of projecting portions 22b (for example in the form of lines or cylinders) each delimited laterally by one or more trenches 22'. The second semiconductor layer 23 is arranged on (or distributed over) the plurality of projecting portions 22b of the first semiconductor layer 22. The first portion 24a of the anode 24 is arranged against at least one side wall of each projecting portion 22b and beneficially against the whole lateral surface of the projecting portions 22b. It is separated from the base portion 22a of the first semiconductor layer 22 by the first electrically insulating layer 26. The latter beneficially covers the bottom of each trench 22'. The second portion 24b of the anode 24 is arranged on each of the projecting portions 22b of the first semiconductor layer 22, in contact with the second conductor layer 23.

In other words, the JBS diode structure represented by FIG. 2 (or FIG. 3) may be duplicated laterally to form a component of larger surface and thus of larger current calibre.

An exemplary method for manufacturing a junction barrier Schottky (JBS) diode will now be described with reference to FIGS. 9A to 9F. These figures schematically represent steps S11 to S16 for manufacturing the JBS diode 20 of FIG. 2.

Figure 9A:
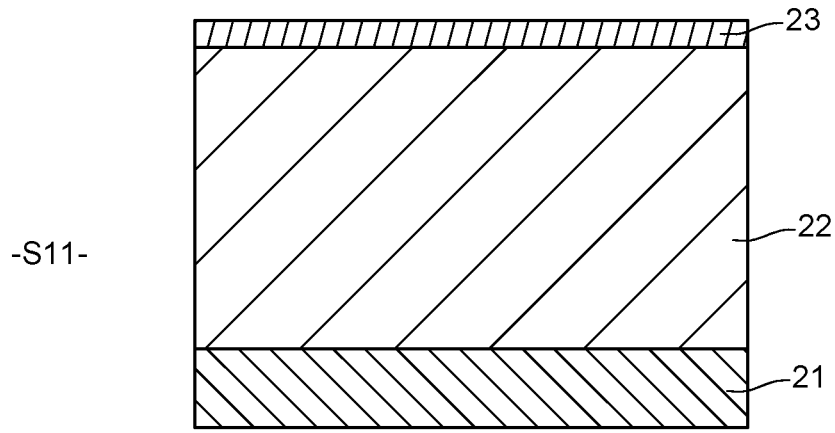
FIG. 9A, FIG. 9B, FIG. 9C, FIG. 9D, FIG. 9E and FIG. 9F represent the steps of a method for manufacturing a junction barrier Schottky diode according to the second aspect of the invention.

Step S11 of FIG. 9A consists in providing a stack comprising successively the substrate 21, the first semiconductor layer 22 (doped with the first type of conductivity) and the second semiconductor layer 23 (doped with the second type of conductivity). The first and second semiconductor layers 22-23, for example made of GaN, are in an embodiment formed by epitaxy. The substrate 21 then serves as growth support for the first and second semiconductor layers 22-23.

Figure 9B:
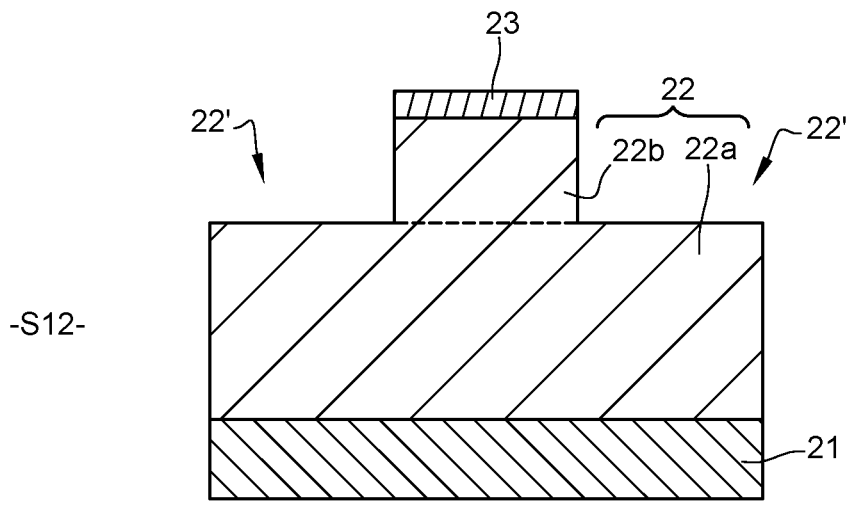

At step S12 of [FIG. 9B], at least one trench 22' is etched in the second semiconductor layer 23 and in a part of the first underlying conductor layer 22 to delimit (at least in part) the base portion 22a and the projecting portion 22b of the first conductor layer 22 and to limit the second semiconductor layer 23 to the projecting portion 22b of the first semiconductor layer 22.

The etching of the trench 22' in the first and second semiconductor layers 22-23 beneficially has an isotropy coefficient greater than or equal to 0.3. The isotropy coefficient is defined as the ratio of the lateral etching speed over the vertical etching speed. Rounded angles with a greater radius of curvature may thus be obtained at the bottom of the trench. These angles make it possible to reduce the electric field in the first electrically insulating layer arranged at the bottom of the trench and to further reduce the reverse leakage current of the JBS diode.

For the sake of clarity, the following steps of the manufacturing method will be described with reference to a single trench 22' (for example annular). They may however be accomplished in the same manner with several trenches (for example rectilinear).

The manufacturing method next comprises the formation of the first electrically insulating layer 26 at the bottom of the trench 22'. In this example, the formation of the first electrically insulating layer 26 comprises steps S13 and S14 represented respectively by FIGS. 9C and 9D.

At step S13 (cf. [FIG. 9C]), the first semiconductor layer 22 is covered with a dielectric material layer 28. This dielectric material layer 28 comprises a first portion 28a arranged on the base portion 22a, at the bottom of the trench 22', and a second portion 28b arranged against at least one side wall of the projecting portion 22b. The first portion 28a has a thickness greater than that of the second portion 28b. The dielectric material layer 28 may be obtained by a non-conformal deposition of dielectric material, for example SiO$_2$. The dielectric material layer 28 in an embodiment covers the whole surface of the substrate (so-called "full wafer" deposition) and thus the whole lateral surface of the projecting portion 22b.

Step S14 (cf. [FIG. 9D]) is a step of isotropic etching of the dielectric material layer 28, accomplished in such a way as to remove only the second portion 28b of the dielectric material layer 28. The first portion 28a of the dielectric material layer 28 is only partially etched and forms the first electrically insulating layer 26.

Figure 9C:
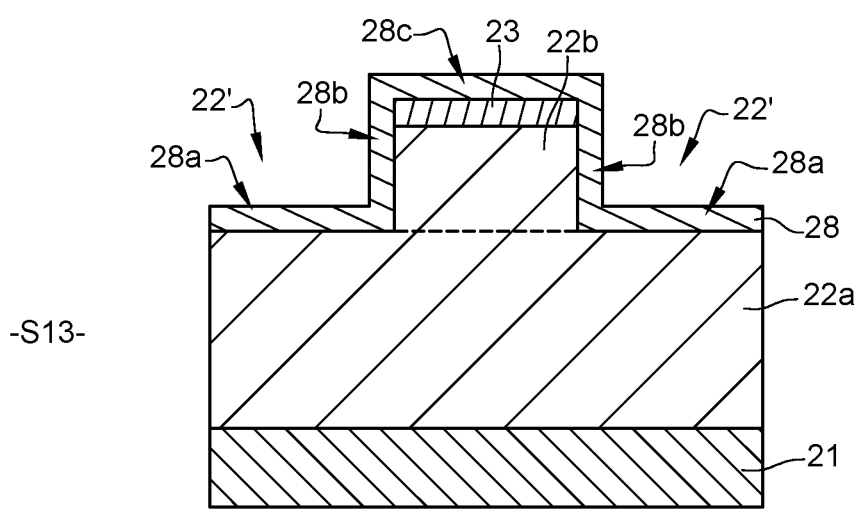
Figure 9D:
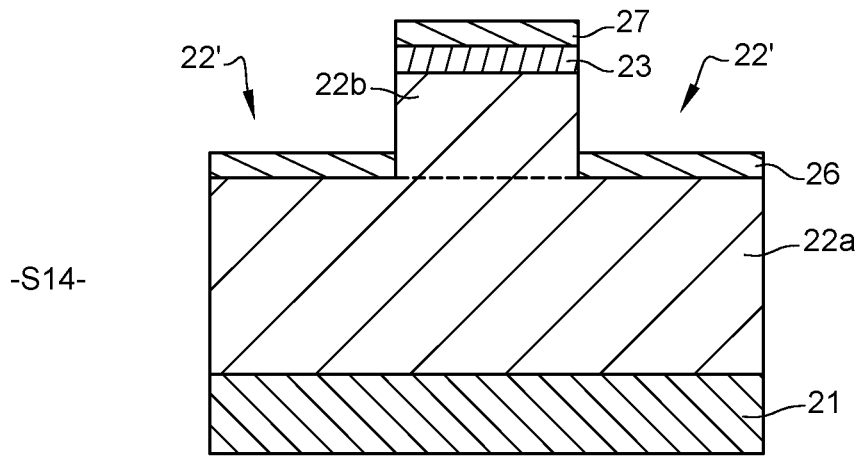

The dielectric material layer 28 may also comprise a third portion 28c covering the second semiconductor layer 23 (cf. FIG. 9C). This third portion 28c of the dielectric material layer 28 initially has a thickness greater than that of the second portion 28b and forms after step S14 of isotropic etching the second electrically insulating layer 27 (cf. FIG. 9D).

Figure 9E:
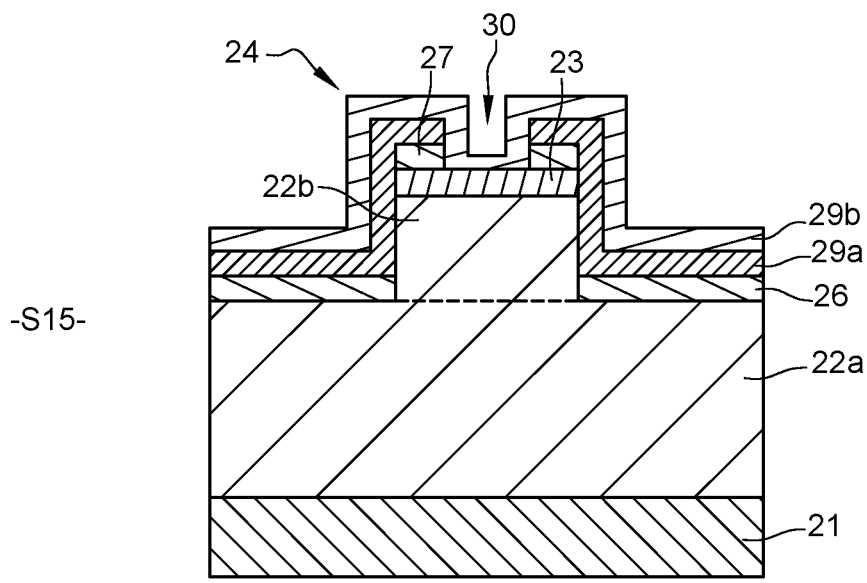

With reference to [FIG. 9E], the method next comprises a step S15 of formation of the anode 24, and more specifically Schottky and ohmic contacts on respectively the first and second semiconductor layers 22-23. The formation of the anode 24 may notably comprise the following operations:

deposition of a first metal layer 29a on the first electrically insulating layer 26, against the side wall of the projecting portion 22b of the first semiconductor layer 22 and on the second semiconductor layer 23;

formation in the first metal layer 29a (and in the second electrically insulating layer 27, if applicable) of an opening 30 emerging on the second semiconductor layer 23;

deposition of a second metal layer 29b in the opening 30, in contact with the second semiconductor layer 23, and beneficially on the first metal layer 29a.

The first and second metal layers 29a-29b are in an embodiment deposited on the whole surface of the substrate (full wafer deposition), for example by chemical (e.g. evaporation) or physical (e.g. cathodic sputtering) process. The deposition may be conformal or non-conformal.

Figure 9F:
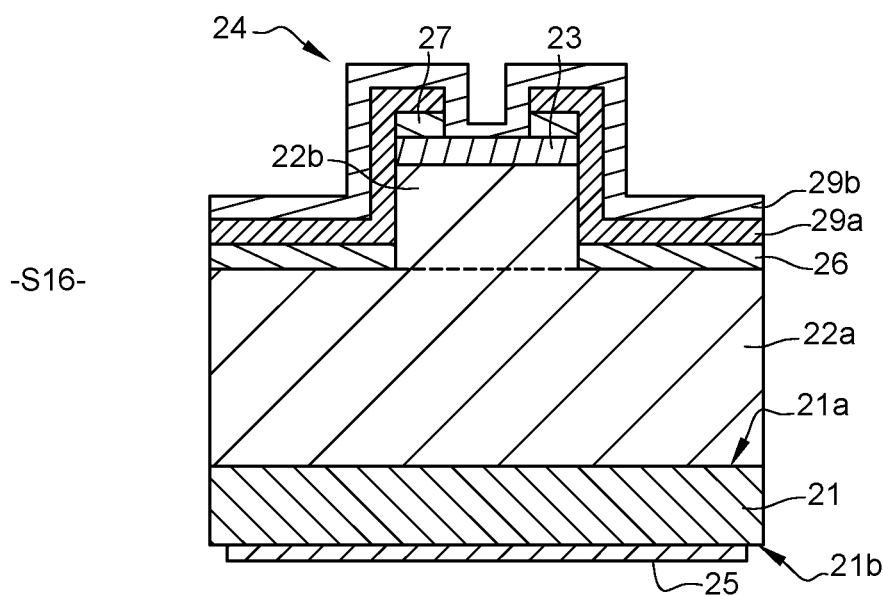

With reference to [FIG. 9F], the manufacturing method further comprises a step S16 of formation of the cathode 25, here on the second opposite face 21b of the substrate 21.

The method for manufacturing the JBS diode 70 according to FIG. 7 comprises, in addition to steps S11-S16 described previously, a step of etching the first and second semiconductor layers 22-23 down to the substrate 21, to free a portion of the first face 21a of the substrate (portion on which the anode 25 will be formed).

The JBS diode according to the invention is not limited to the embodiments described with reference to FIGS. 2, 7-8 and numerous alternatives and modifications will become clear to those skilled in the art. In particular, the substrate 21, the first semiconductor layer 22 and/or the second semiconductor layer 23 of the JBS diode may comprise a semiconductor material other than GaN, for example silicon carbide (SiC) or silicon (Si).

The invention claimed is:

1. A junction barrier Schottky diode comprising:
a substrate;
a first semiconductor layer arranged on a first face of the substrate and having a first type of conductivity, the first semiconductor layer comprising a projecting portion delimited by a trench;
a second semiconductor layer arranged on the projecting portion of the first semiconductor layer and having a second type of conductivity opposite to the first type of conductivity;
an electrically insulating layer arranged at the bottom of the trench;
a first electrode comprising:
a first portion in Schottky contact with the first semiconductor layer, the first portion of the first electrode being arranged on the electrically insulating layer and against a side wall of the projecting portion of the first semiconductor layer;
a second portion in ohmic contact with the second semiconductor layer;
a second electrode in ohmic contact with the substrate.

2. The diode according to claim 1, wherein the Schottky contact has a height ($H_S$) comprised between 0.1 μm and 3 μm.

3. The diode according to claim 1, wherein the first portion of the first electrode is formed by a layer of a first metal and the second portion of the first electrode is formed by a layer of a second metal, distinct from the first metal.

4. The diode according to claim 3, wherein the second metal has a work function greater than the work function of the first metal.

5. The diode according to claim 1, wherein the second electrode is arranged on a second face of the substrate opposite to the first face.

6. The diode according to claim 1, wherein the first semiconductor layer only occupies a part of the first face of the substrate and the second electrode is arranged on the first face of the substrate.

7. The diode according to claim 1, wherein the first semiconductor layer comprises a plurality of projecting portions each delimited by a trench, the second semiconductor layer is arranged on the plurality of projecting portions of the first semiconductor layer, the first portion of the first electrode is arranged against a side wall of each projecting portion of the first semiconductor layer and the second portion of the first electrode is arranged on each projecting portion of the first semiconductor layer in contact with the second semiconductor layer.

8. The diode according to claim 1, wherein a contact surface between the first semiconductor layer and the second semiconductor layer and a contact surface between the first portion of the first electrode and the first semiconductor layer are situated in secant planes.

9. A method for manufacturing a junction barrier Schottky diode comprising the following steps:
forming a stack comprising successively a substrate, a first semiconductor layer having a first type of conductivity and a second layer having a second type of conductivity opposite to the first type of conductivity;
etching a trench in the second semiconductor layer and a part of the first semiconductor layer, so as to delimit a projecting portion of the first semiconductor layer and to limit the second semiconductor layer to the projecting portion of the first semiconductor layer;
forming an electrically insulating layer at the bottom of the trench;
forming a first electrode comprising:
a first portion in Schottky contact with the first semiconductor layer, the first portion of the first electrode being arranged on the electrically insulating layer and against a side wall of the projecting portion of the first semiconductor layer;
a second portion in ohmic contact with the second semiconductor layer;
forming a second electrode in ohmic contact with the substrate.

10. The method according to claim 9, wherein the step of etching the trench has an isotropy coefficient greater than 0.3.

11. The method according to claim 9, wherein the step of formation of the electrically insulating layer at the bottom of the trench comprises the following operations:
forming a dielectric material layer comprising a first portion arranged at the bottom of the trench and a second portion arranged against the side wall of the projecting portion of the first semiconductor layer, the first portion having a thickness greater than that of the second portion; and
etching in an isotropic manner the dielectric material layer in such a way as to remove only the second portion.

12. The method according to claim 9, wherein the step of formation of the first electrode comprises the following operations:
depositing a layer of a first metal on the electrically insulating layer, against the side wall of the projecting portion of the first semiconductor layer and on the second semiconductor layer;
forming in the layer of the first metal an opening emerging on the second semiconductor layer;

depositing a layer of a second metal in the opening, in contact with the second semiconductor layer, the second metal being distinct from the first metal.

* * * * *